United States Patent
Nakamura et al.

(10) Patent No.: US 11,581,140 B2
(45) Date of Patent: Feb. 14, 2023

(54) CERAMIC ELECTRONIC COMPONENT AND METHOD OF MANUFACTURING THE SAME

(71) Applicant: TAIYO YUDEN CO., LTD., Tokyo (JP)

(72) Inventors: Tomoaki Nakamura, Tokyo (JP); Mikio Tahara, Tokyo (JP); Sadanori Shimoda, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 316 days.

(21) Appl. No.: 17/038,805

(22) Filed: Sep. 30, 2020

(65) Prior Publication Data
US 2021/0151252 A1 May 20, 2021

(30) Foreign Application Priority Data
Nov. 18, 2019 (JP) ............... JP2019-208174

(51) Int. Cl.
| | | |
|---|---|---|
| *H01G 4/12* | (2006.01) | |
| *H01L 49/02* | (2006.01) | |
| *H01L 27/08* | (2006.01) | |
| *H01G 4/30* | (2006.01) | |
| *H01G 4/008* | (2006.01) | |

(52) U.S. Cl.
CPC .............. *H01G 4/12* (2013.01); *H01G 4/008* (2013.01); *H01G 4/30* (2013.01); *H01L 27/0805* (2013.01); *H01L 28/60* (2013.01)

(58) Field of Classification Search
CPC .......... H01G 4/008; H01G 4/012; H01G 4/12; H01G 4/1209; H01G 4/1227; H01G 4/232; H01G 4/30; H01L 27/0805; H01L 28/60
See application file for complete search history.

(56) References Cited

U.S. PATENT DOCUMENTS

| | | | | |
|---|---|---|---|---|
| 4,701,827 A | * | 10/1987 | Fujikawa | H01G 4/2325 361/309 |
| 2011/0149470 A1 | * | 6/2011 | Hur | H01G 4/12 29/25.42 |
| 2015/0016018 A1 | * | 1/2015 | Onishi | H01G 4/30 310/365 |
| 2016/0042867 A1 | * | 2/2016 | Kisumi | H01G 4/12 29/25.03 |
| 2016/0268046 A1 | * | 9/2016 | Nishisaka | H01G 4/232 |
| 2019/0051467 A1 | * | 2/2019 | Kimura | H01G 4/0085 |

FOREIGN PATENT DOCUMENTS

JP  2011-135079 A  7/2011

* cited by examiner

Primary Examiner — Nathan Milakovich
(74) Attorney, Agent, or Firm — Chen Yoshimura LLP

(57) ABSTRACT

A ceramic electronic component includes a multilayer chip having a substantially rectangular parallelepiped shape and including dielectric layers and internal electrode layers that are alternately stacked, the internal electrode layers being alternately exposed to two edge faces of the multilayer chip facing each other, and a pair of external electrodes respectively formed on the two edge faces so as to be connected to the internal electrode layers exposed on the respective edge faces, each external electrode extending to at least one side face of the multilayer chip, wherein in the multilayer chip, oxides including Zn and Ni are present around the internal electrode layer in a vicinity of a connection part connecting the internal electrode layer to the external electrode.

6 Claims, 8 Drawing Sheets

CERAMIC ELECTRONIC COMPONENT AND METHOD OF MANUFACTURING THE SAME

CROSS-REFERENCE TO RELATED APPLICATION

This application is based upon and claims the benefit of priority of the prior Japanese Patent Application No. 2019-208174, filed on Nov. 18, 2019, the entire contents of which are incorporated herein by reference.

FIELD

A certain aspect of the present disclosure relates to a ceramic electronic component and a method of manufacturing the same.

BACKGROUND

To achieve a smaller size and a larger capacitance of the multilayer ceramic capacitor, it has been promoted to thin the internal electrode layers and the dielectric layers to increase the number of the internal electrode layers and the dielectric layers that are stacked and to thin the top cover layer and the bottom cover layer.

When the number of the internal electrode layers and the dielectric layers that are stacked is increased and the thickness of the cover layer is reduced, cracks may occur in the area where the cover layer, a side margin, and an end margin overlap when external electrodes are baked. The side margin is a region located from each of the two side faces of the multilayer chip to the internal electrode layer, and the end margin is a region where the internal electrode layers connected to the same external electrode face each other without interposing the internal electrode layer connected to the other external electrode therebetween.

To inhibit occurrence of the crack, the length of the region where the metal component of the external electrode is diffused in the internal electrode layer (the diffusion length) is controlled as disclosed in, for example, Japanese Patent Application Publication No. 2011-135079.

SUMMARY OF THE INVENTION

When the baking temperature of the external electrode is lowered, the diffusion length of the metal component of the external electrode is reduced. However, reduction in the baking temperature may cause the reaction between the internal electrode layer and the external electrode to insufficiently proceed, and degrade the contact between the internal electrode layer and the external electrode in combination with the reduction in the thickness of the internal electrode layer (0.5 μm or less).

The present invention has a purpose of providing a ceramic electronic component and a method of manufacturing the same that are capable of inhibiting occurrence of a crack and improving the contact between the internal electrode layer and the external electrode.

According to a first aspect of the embodiments, there is provided a ceramic electronic component including: a multilayer chip having a substantially rectangular parallelepiped shape and including dielectric layers and internal electrode layers that are alternately stacked, the internal electrode layers being alternately exposed to two edge faces of the multilayer chip facing each other; and a pair of external electrodes respectively formed on the two edge faces so as to be connected to the internal electrode layers exposed on the respective edge faces, each external electrode extending to at least one side face of the multilayer chip, wherein in the multilayer chip, oxides including Zn and Ni are present around the internal electrode layer in a vicinity of a connection part connecting the internal electrode layer to the external electrode.

According to a second aspect of the embodiments, there is provided a method of manufacturing a ceramic electronic component, including: alternately stacking green sheets for ceramic dielectric layers and first conductive pastes for internal electrode layers so that the internal electrode layers are alternately exposed to two edge faces facing each other so as to form a ceramic multilayer structure having a substantially rectangular parallelepiped shape, the first conductive pastes being mainly composed of Ni; firing the ceramic multilayer structure to form a multilayer chip; subjecting the multilayer chip to heat treatment; disposing a second conductive paste on each of the two edge faces of the multilayer chip such that the second conductive paste is in contact with the internal electrode layers exposed to the corresponding edge face, the second conductive paste containing metal powder and a glass component including 20 to 30 weight % of ZnO; and baking the second conductive paste to form oxides including Zn and Ni around each of the internal electrode layers in a vicinity of a connection part between the internal electrode layer and the second conductive paste.

According to a third aspect of the embodiments, there is provided a method of manufacturing a ceramic electronic component, including: alternately stacking green sheets for ceramic dielectric layers and first conductive pastes for internal electrode layers so that the internal electrode layers are alternately exposed to two edge faces facing each other so as to form a ceramic multilayer structure having a substantially rectangular parallelepiped shape, the first conductive pastes being mainly composed of Ni; firing the ceramic multilayer structure to form a multilayer chip; disposing a second conductive paste on each of the two edge faces of the multilayer chip such that the second conductive paste is in contact with the internal electrode layers exposed to the corresponding edge face, the second conductive paste containing metal powder and a glass component including 20 to 30 weight % of ZnO; and baking the second conductive paste while an oxygen concentration in a temperature rising region is made to be 10 ppm or greater, to form oxides including Zn and Ni around each of the internal electrode layers in a vicinity of a connection part between the internal electrode layer and the second conductive paste.

According to a fourth aspect of the embodiments, there is provided a method of manufacturing a ceramic electronic component, including: alternately stacking green sheets for ceramic dielectric layers and first conductive pastes for internal electrode layers so that the internal electrode layers are alternately exposed to two edge faces facing each other so as to form a ceramic multilayer structure having a substantially rectangular parallelepiped shape, the first conductive pastes being mainly composed of Ni; firing the ceramic multilayer structure to form a multilayer chip; applying a glass paste containing 20 to 30 weight % of ZnO to each of the two edge faces of the multilayer chip; baking the glass paste to form oxides including Zn and Ni around each of the internal electrode layers adjacent to the two edge faces; disposing a second conductive paste on each of the two edge faces of the multilayer chip such that the second conductive paste is in contact with the internal electrode layers exposed to the corresponding edge face, the second conductive paste containing metal powder and a glass component; and baking the second conductive paste.

DETAILED DESCRIPTION

Hereinafter, with reference to the accompanying drawings, a description will be given of an embodiment.

Embodiment

Figure 1:
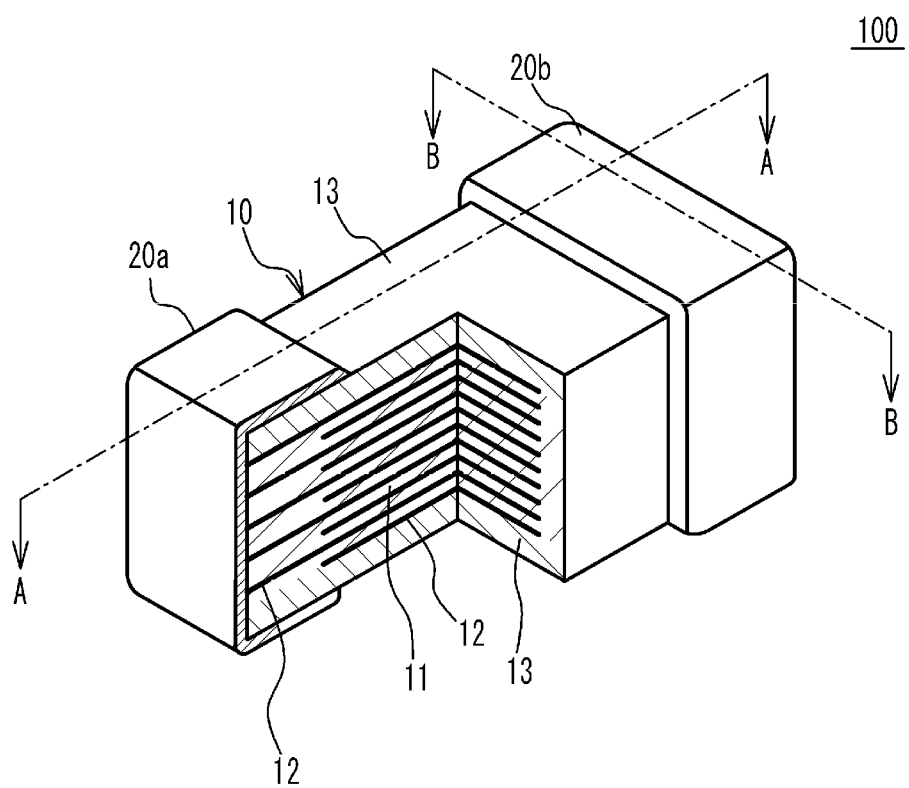
FIG. 1 is a partial cross-sectional perspective view of a multilayer ceramic capacitor in accordance with an embodiment.

First, a multilayer ceramic capacitor will be described. FIG. 1 is a partial cross-sectional perspective view of a multilayer ceramic capacitor 100 in accordance with an embodiment. As illustrated in FIG. 1, the multilayer ceramic capacitor 100 includes a multilayer chip 10 having a rectangular parallelepiped shape, and external electrodes 20a and 20b that are respectively provided on two edge faces of the multilayer chip 10 facing each other. Four faces other than the two edge faces of the multilayer chip 10 are referred to as side faces. The external electrodes 20a and 20b extend to the four side faces. However, the external electrodes 20a and 20b are spaced from each other on the four side faces.

The multilayer chip 10 have a structure designed to have dielectric layers 11 and internal electrode layers 12 alternately stacked. The dielectric layer 11 contains a ceramic material acting as a dielectric material. End edges of the internal electrode layers 12 are alternately exposed to a first edge face of the multilayer chip 10 and a second edge face of the multilayer chip 10 that is different from the first edge face. The external electrode 20a is provided on the first edge face. The external electrode 20b is provided on the second edge face. Thus, the internal electrode layers 12 are alternately electrically connected to the external electrode 20a and the external electrode 20b. In the multilayer chip 10, cover layers 13 form two side faces corresponding to the top face and the bottom face in the direction in which the dielectric layers 11 and the internal electrode layer 12 are stacked (hereinafter, referred to as a stack direction) among the four side faces. The cover layer 13 is mainly composed of a ceramic material. For example, the main component of the cover layer 13 is the same as the main component of the dielectric layer 11.

For example, the multilayer ceramic capacitor 100 may have a length of 0.25 mm, a width of 0.125 mm, and a height of 0.125 mm. The multilayer ceramic capacitor 100 may have a length of 0.4 mm, a width of 0.2 mm, and a height of 0.2 mm. The multilayer ceramic capacitor 100 may have a length of 0.6 mm, a width of 0.3 mm, and a height of 0.3 mm. The multilayer ceramic capacitor 100 may have a length of 1.0 mm, a width of 0.5 mm, and a height of 0.5 mm. The multilayer ceramic capacitor 100 may have a length of 3.2 mm, a width of 1.6 mm, and a height of 1.6 mm. The multilayer ceramic capacitor 100 may have a length of 4.5 mm, a width of 3.2 mm, and a height of 2.5 mm.

The dielectric layer 11 is mainly composed of a ceramic material having a perovskite structure expressed by a general formula $ABO_3$. The perovskite structure includes $ABO_{3-q}$ having an off-stoichiometric composition. Examples of such a ceramic material include, but are not limited to, barium titanate ($BaTiO_3$), calcium zirconate ($CaZrO_3$), calcium titanate ($CaTiO_3$), strontium titanate ($SrTiO_3$), and $Ba_{1-x-y}Ca_xSr_yTi_{1-z}Zr_zO_3$ ($0 \le x \le 1$, $0 \le y \le 1$, $0 \le z \le 1$) having a perovskite structure. The average thickness of the dielectric layer 11 is, for example, 1 µm or less.

The internal electrode layer 12 is mainly composed of nickel (Ni). The average thickness of the internal electrode layer 12 is, for example, 1 µm or less.

Figure 2A:
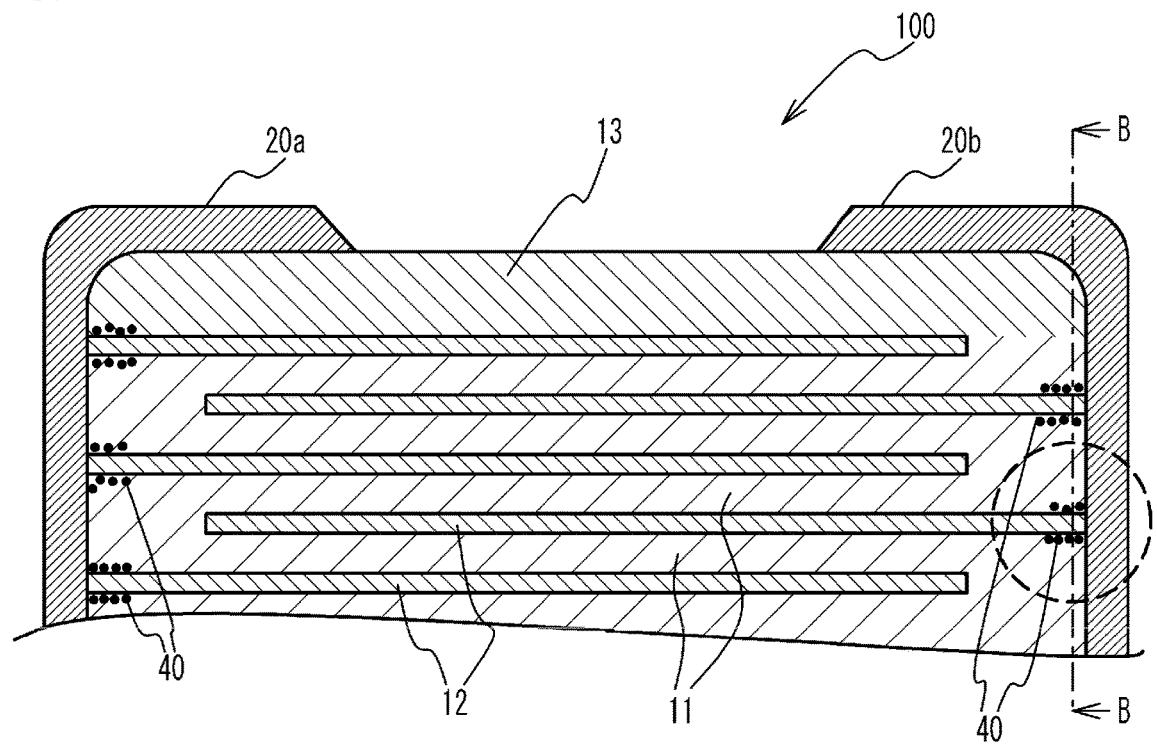
FIG. 2A is a partial cross-sectional view taken along line A-A in FIG. 1.
Figure 2B:
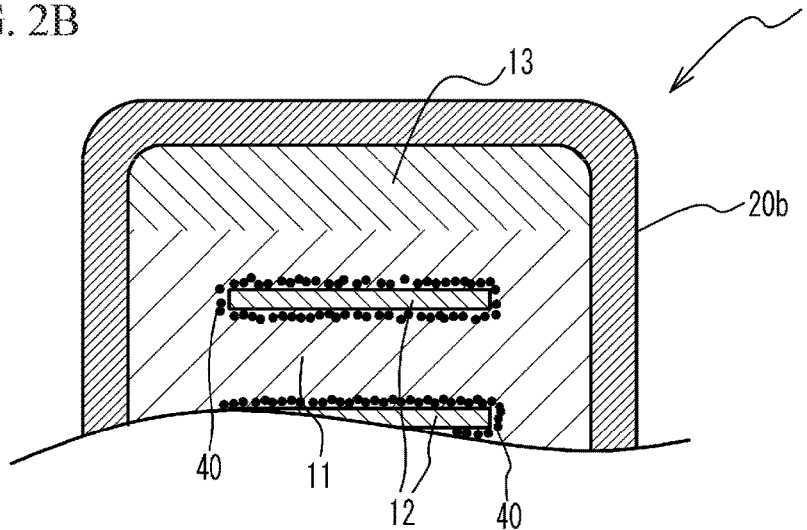
FIG. 2B is a partial cross-sectional view taken along line B-B in FIG. 1.
Figure 2C:
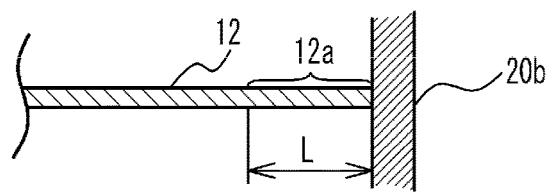
FIG. 2C is an enlarged view of an area surrounded by a dotted line in FIG. 2A.

FIG. 2A is a partial cross-sectional view taken along line A-A in FIG. 1, FIG. 2B is a partial cross-sectional view taken along line B-B in FIG. 1, and FIG. 2C is an enlarged view of an area surrounded by a dotted line in FIG. 2A. As illustrated in FIG. 2A, in at least a part of the region where the internal electrode layers 12 connected to the same external electrode face each other without interposing the internal electrode layer 12 connected to the other external electrode therebetween, oxides 40 including zinc (Zn) and Ni are present near the upper face and the lower face of each of the internal electrode layer 12. In addition, as illustrated in FIG. 2B, in at least a part of the region where the internal electrode layers 12 connected to the same external electrode face each other without interposing the internal electrode layer 12 connected to the other external electrode therebetween, the oxides 40 are present near the side faces of each of the internal electrode layer 12. That is, the oxides 40 including Zn and Ni are present around the internal electrode layer 12 in the vicinity of the connection part between the external electrode 20a, 20b and the internal electrode layer 12. Since the oxides 40 are present, the adhesion between the internal electrode layer 12 and the dielectric layer 11 improves, and penetration of water or the like is inhibited. Thus, the moisture resistant reliability of the multilayer ceramic capacitor 100 improves. The presence of Zn and Ni around the internal electrode layer 12 in the vicinity of the connection part between the external electrode 20a, 20b and the internal electrode layer 12 can be confirmed by element mapping of energy dispersive X-ray spectrometry (EDX). It can be confirmed that Zn and Ni are oxides with a scanning electron microscope (SEM) or metallographic microscope.

In addition, the internal electrode layer 12 has a region 12a where the main component (in this embodiment, copper (Cu)) of a base conductive layer 21 of the external electrode 20a, 20b is diffused (hereinafter, referred to as a diffusion region of Cu). The region 12a extends from the connection part between the external electrode 20a, 20b and the internal electrode layer 12 toward the internal electrode layer 12. The length L of the diffusion region 12a in the direction in which the two edge faces of the multilayer chip 10 face each other (that is the diffusion length) is 5 μm or less. The length L of the diffusion region 12a of Cu can be measured from the Cu mapping photo of the EDX. In the Cu mapping photo of the cross-section presented in FIG. 2C, the distance from the external electrode to the farthest position from the external electrode among the positions where Cu is observed is defined as the length L of the diffusion region 12a of Cu. For example, for each of five internal electrodes at different positions in the stack direction of one product, the length L of the diffusion region 12a of Cu is measured, and the average value of the lengths L in the five internal electrodes may be determined to be the length L of the diffusion region 12a of Cu.

Figure 3:
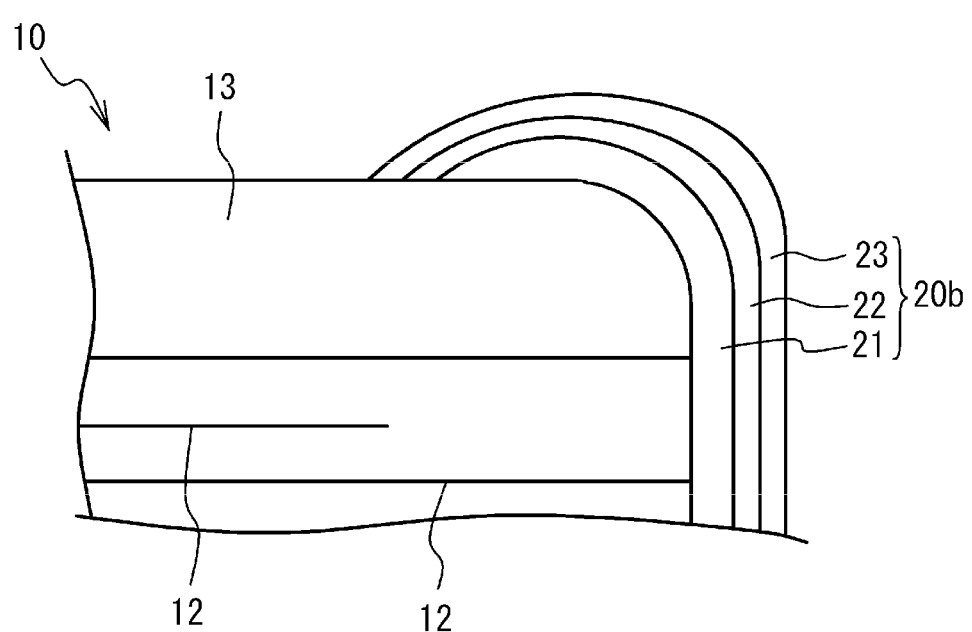
FIG. 3 is a partial cross-sectional view taken along line A-A in FIG. 1.

FIG. 3 is a cross-sectional view of the external electrode 20b, and is a partial cross-sectional view taken along line A-A in FIG. 1. In FIG. 3, hatching for indicating the cross-section is omitted. A ceramic material is mainly exposed to the surface of the multilayer chip 10. Thus, it is difficult to form a plated layer without a base layer on the surface of the multilayer chip 10. Thus, as illustrated in FIG. 3, the external electrode 20b has a structure in which a plated layer is formed on the base conductive layer 21 formed on the surface of the multilayer chip 10. The plated layer includes a first plated layer 22 that is in contact with and covers the base conductive layer 21, and a second plated layer 23 that is in contact with and covers the first plated layer 22. A base plated layer may be interposed between the base conductive layer 21 and the first plated layer 22. The base conductive layer 21 is mainly composed of a metal such as Cu, Ni, aluminum (Al), Zn, silver (Ag), gold (Au), palladium (Pd), or platinum (Pt), or alloy of two or more of them (for example, alloy of Cu and Ni), and contains a glass component for densifying the base conductive layer 21 and ceramic such as a co-material for controlling the sinterability of the base conductive layer 21. The glass component is oxide of barium (Ba), strontium (Sr), calcium (Ca), Zn, Al, silicon (Si), or boron (B). The co-material is a ceramic component mainly composed of the same material as the main component of the dielectric layer 11. The plated layer is mainly composed of a metal such as Cu, Ni, Al, Zn, or tin (Sn) or alloy of two or more of them. The first plated layer 22 is, for example, a Ni plated layer, and the second plated layer 23 is, for example, a Sn plated layer.

The multilayer ceramic capacitor 100 according to the present embodiment includes the multilayer chip 10 and a pair of the external electrodes 20a and 20b formed from two edge faces facing each other of the multilayer chip 10 to at least one side face of the multilayer chip 10. The multilayer chip 10 has a substantially rectangular parallelepiped shape, and includes the dielectric layers 11 mainly composed of ceramic and the internal electrode layers 12 mainly composed of Ni that are alternately stacked. The stacked internal electrode layers 12 are formed so as to be alternately exposed to the two edge faces. The oxides 40 including Zn and Ni are present around the internal electrode layer 12 in the vicinity of the connection part between the internal electrode layer 12 and the external electrode 20a, 20b. Since the oxides 40 including Zn and Ni are formed around the internal electrode layer 12, the adhesion between the internal electrode layer 12 and the dielectric layer 11 improves, and thereby, penetration of water is inhibited. Thus, the moisture resistant reliability of the multilayer ceramic capacitor 100 is improved.

In the internal electrode layer 12, as the length of the diffusion region 12a where Cu, which is the main component of the base conductive layer 21, is diffused in the direction in which the two edge faces face each other increases, the part where Ni, which is the main component of the internal electrode layer 12, is discontinuous (a discontinuous part) is filled with the diffused Cu. Thus, the continuousness of the internal electrode layer 12 increases. However, as the length of the diffusion region 12a in the direction where the two edge faces face each other increases, the volume expansion of the internal electrode layer 12 increases. Thereby, cracks are more likely to occur. Thus, in the internal electrode layer 12, the length of the diffusion region 12a where Cu, which is the main component of the base conductive layer 21, is diffused in the facing direction of the two edge faces is preferably 5 μm or less, more preferably 3 μm or less.

The electric capacitance of the multilayer ceramic capacitor 100 can be increased by reducing the average thickness of the internal electrode layer 12 and increasing the number of the internal electrode layers 12 that are stacked. In addition, the multilayer ceramic capacitor 100 can be decreased in size by reducing the average thickness of the internal electrode layer 12 without changing the number of the internal electrode layers 12 that are stacked. Thus, the average thickness of the internal electrode layer 12 is preferably 0.5 μm or less, more preferably 0.3 μm or less.

Figure 4A:
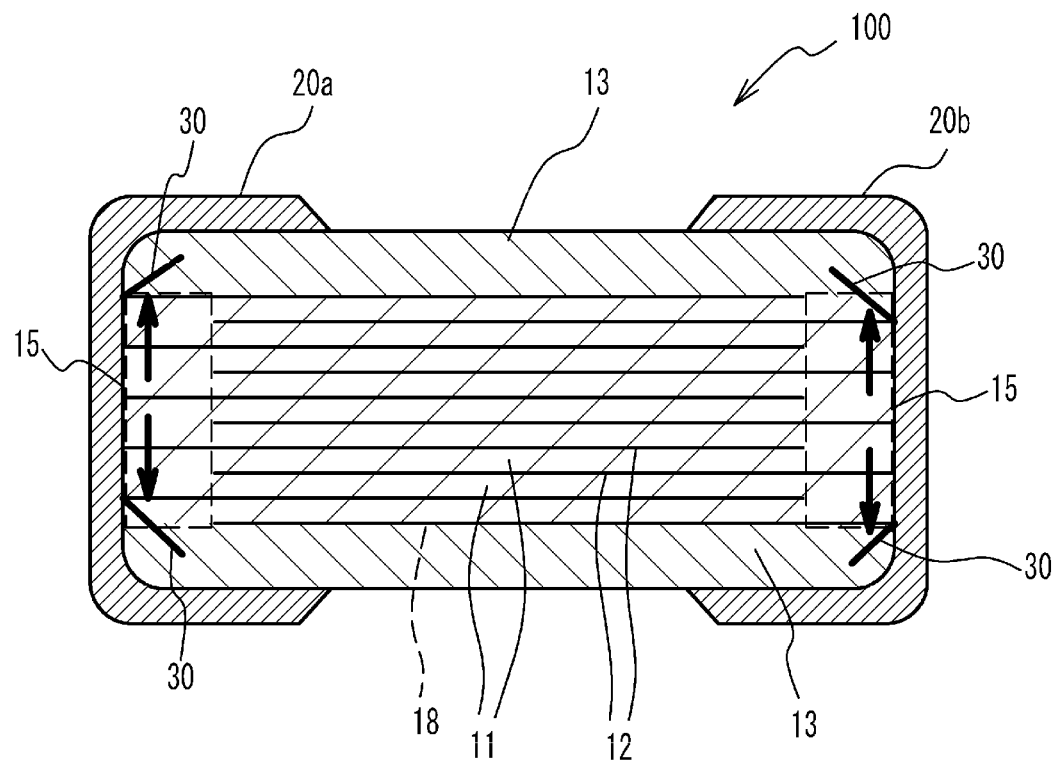
FIG. 4A and FIG. 4B are diagrams for describing occurrence of a crack.
Figure 4B:
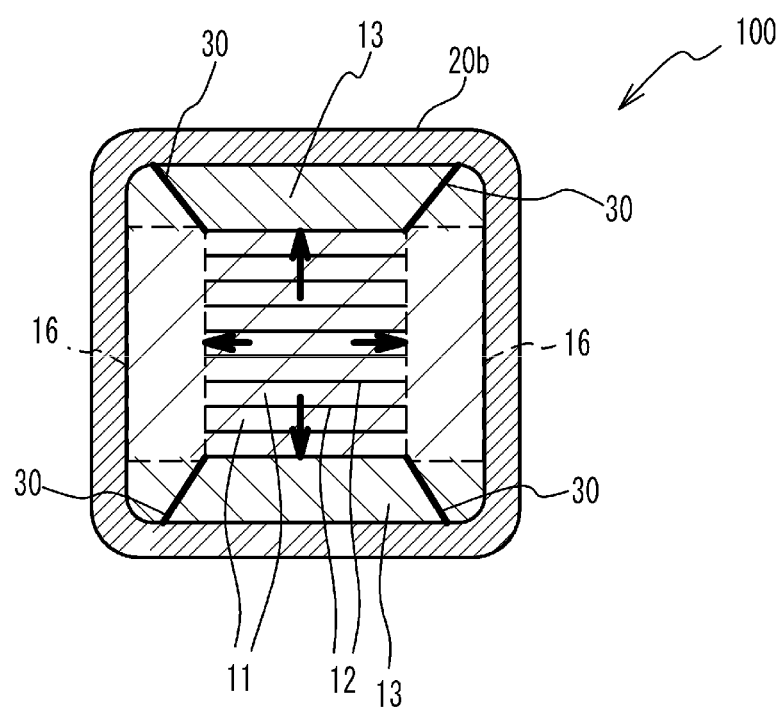

In the manufacturing process of the multilayer ceramic capacitor 100, a crack 30 may occur in a part where the cover layer 13, a side margin 16, and an end margin 15 overlap as illustrated in FIG. 4A and FIG. 4B when the external electrodes 20a and 20b are baked. This is considered because the internal electrode layers 12 react with the external electrodes 20a and 20b during baking, and Cu, which is the metal component of the external electrodes 20a and 20b, diffuses to the internal electrode layers 12, and the internal electrode layers 12 expand, causing the outward stress in the side margin 16 and the end margin 15 as indicated by arrows in FIG. 4A and FIG. 4B. FIG. 4A corresponds to a cross-section taken along line A-A in FIG. 1, and FIG. 4B corresponds to a cross-section taken along line B-B in FIG. 1. As illustrated in FIG. 4A, the end margins 15 are a region where the internal electrode layers 12 connected to the external electrode 20a face each other without interposing the internal electrode layer 12 connected to the external electrode 20b therebetween, and a region where the internal electrode layers 12 connected to the external electrode 20b face each other without interposing the internal electrode layer 12 connected to the external electrode 20a therebetween. The side margins 16 are regions located from the two side faces of the multilayer chip 10 to the internal electrode layers 12 as illustrated in FIG. 4B.

Figure 5:
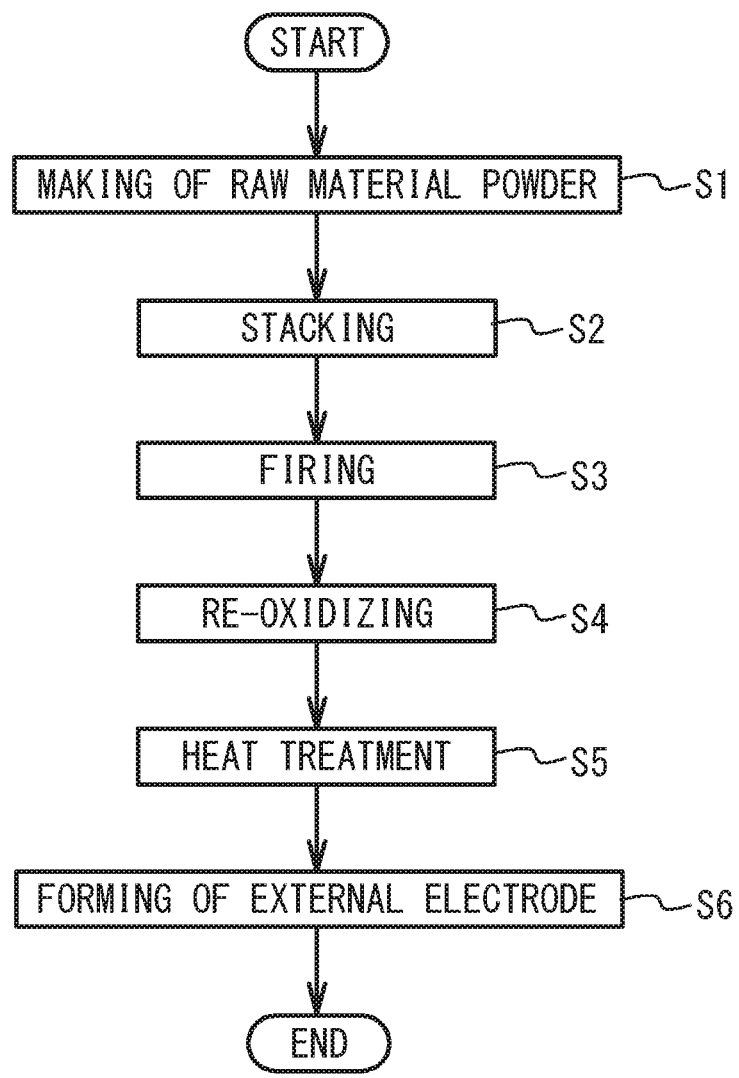
FIG. 5 is a flowchart of a method of manufacturing the multilayer ceramic capacitor.

A description is now be given of a method of manufacturing the multilayer ceramic capacitor 100 that can inhibit occurrence of cracks due to diffusion of the metal component of the external electrodes 20a and 20b during baking of the external electrodes 20a and 20b and improve the contact between the internal electrode layers 12 and the external electrodes 20a and 20b. FIG. 5 is a diagram illustrating a method of manufacturing the multilayer ceramic capacitor 100.

[Making Process of Raw Material Powder (S1)]

Additive compound is added to powder of a ceramic material that is a main component of the dielectric layer 11, in accordance with purposes. The additive compound may be an oxide of magnesium (Mg), manganese (Mn), vanadium (V), chromium (Cr) or a rare earth element (yttrium (Y), samarium (Sm), europium (Eu), gadolinium (Gd), terbium (Tb), dysprosium (Dy), holmium (Ho), erbium (Er), thulium (Tm), and ytterbium (Yb)), or an oxide of cobalt (Co), Ni, lithium (Li), B, sodium (Na), potassium (K) and Si, or glass. For example, compound including additive compound is added to ceramic material powder and is calcined. Next, the resulting ceramic material particles are wet-blended with additive compound, is dried and is crushed. Thus, the ceramic material powder is prepared.

[Stacking Process (S2)]

Next, a binder such as polyvinyl butyral (PVB) resin, an organic solvent such as ethanol or toluene, and a plasticizer are added to the resulting ceramic material powder and wet-blended. With use of the resulting slurry, a strip-shaped dielectric green sheet with a thickness of 1.0 µm or less is coated on a base material by, for example, a die coater method or a doctor blade method, and then dried.

Then, a pattern of the internal electrode layer 12 is provided on the surface of the dielectric green sheet by printing a conductive paste for internal electrode layer with use of screen printing or gravure printing. The conductive paste for internal electrode layer includes powder of Ni, which is the main component metal of the internal electrode layer 12, a binder, a solvent, and additives as needed. It is preferable that the binder and the solvent are different from those of the above-mentioned ceramic slurry. As a co-material, the ceramic material that is the main component of the dielectric layer 11 may be dispersed in the conductive paste for internal electrode layer.

Then, the dielectric green sheet on which the internal electrode layer pattern is printed is stamped into a predetermined size, and a predetermined number (for example, 200 to 500) of stamped dielectric green sheets are stacked while the base material is peeled so that the internal electrode layers 12 and the dielectric layers 11 are alternated with each other and the end edges of the internal electrode layers 12 are alternately exposed to both edge faces in the length direction of the dielectric layer so as to be alternately led out to a pair of external electrodes of different polarizations. Cover sheets, which are to be the cover layers 13, are compressed on the stacked green sheets and under the stacked green sheets. The resulting compact is cut into a predetermined size (for example, 1.0 mm×0.5 mm). Through the above processes, a ceramic multilayer structure having a substantially rectangular parallelepiped shape is obtained.

[Firing Process (S3)]

The obtained ceramic multilayer structure is fired for approximately two hours in a reductive atmosphere including, for example, approximately 1.0 volume % of $H_2$ at a firing temperature of approximately 1100° C. to 1400° C. Through this process, obtained is the multilayer chip 10 in which the sintered dielectric layers 11 and the sintered internal electrode layers 12 are alternately stacked and the cover layers 13 are formed as outermost layers of the multilayer chip 10 in the stack direction. To inhibit deterioration in temperature characteristics due to excessive sintering, the firing temperature is preferably 1100° C. to 1200° C.

[Re-Oxidizing Process (S4)]

The resulting sintered structure may be subjected to a re-oxidizing process in a $N_2$ gas atmosphere in a temperature range of 600° C. to 1000° C.

[Heat Treatment Process (S5)]

Then, the multilayer chip 10 is subjected to heat treatment in an air atmosphere at a temperature of 600° C. to 700° C. This process partially oxidizes the edge faces of the internal electrode layers 12 exposed to the two edge faces of the multilayer chip 10. That is, oxides of Ni, which is the main component of the internal electrode layer 12, are formed on the edge faces of the internal electrode layers 12.

[Forming Process of External Electrodes (S6)]

Then, a conductive paste for base conductive layer is applied to each of the two edge faces to which the internal electrode layer patterns of the multilayer chip 10 after the heat treatment process are exposed. The conductive paste for base conductive layer contains powder of the main component metal (in this embodiment, Cu) of the base conductive layer 21, a glass component, a binder, a solvent, and other auxiliary agents as needed. The binder and the solvent may be the same as those of the ceramic paste described above. The glass component contains 20 to 30 weight % of ZnO when the total weight of the glass component is defined as 100 weight %. In addition, the glass component includes one or more network former oxides selected from $B_2O_3$ and $SiO_2$. The glass component may include one or more network modifier oxides selected from $Al_2O_3$, CuO, $Li_2O$, $Na_2O$, $K_2O$, MgO, CaO, BaO, $ZrO_2$, and $TiO_2$.

The reason why the ratio of ZnO is made to be 20 to 30 weight % is because Zn easily reacts with oxide of Ni formed on the edge face of the internal electrode layer 12 by heat treatment, and forms oxides including Zn and Ni around the internal electrode layer 12 during baking of the base conductive layer 21 described later. Formation of oxides including Zn and Ni around the internal electrode layer 12 causes the glass component of the conductive paste for base conductive layer to blend with the internal electrode layer 12. Thereby, Ni particles of the internal electrode layer 12 and Cu particles of the base conductive layer 21 are wet with each other, and thereby, the internal electrode layer 12 and the base conductive layer 21 easily react with each other. Thus, the contact between the internal electrode layers 12 and the external electrode 20a and the contact between the internal electrode layers 12 and the external electrode 20b improve.

Then, the multilayer chip 10 to which the conductive paste for base conductive layer is applied is baked in a nitrogen atmosphere at a temperature of approximately 770° C. or less. Through this process, the base conductive layer 21 is baked, and a semi-finished product of the multilayer ceramic capacitor 100 is obtained. Here, the reason why the baking temperature of the base conductive layer 21 is preferably approximately 770° C. or less will be described.

Figure 6A:
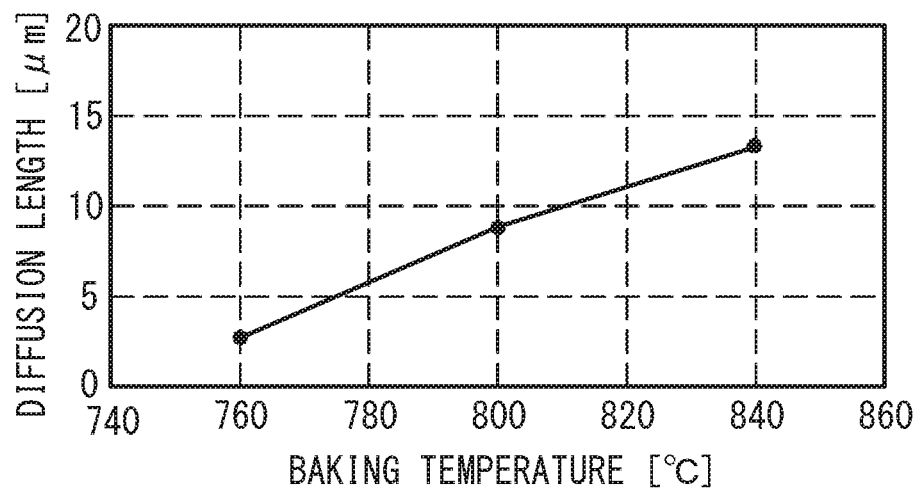
FIG. 6A illustrates a relationship between a baking temperature and a diffusion length of Cu.
Figure 6B:
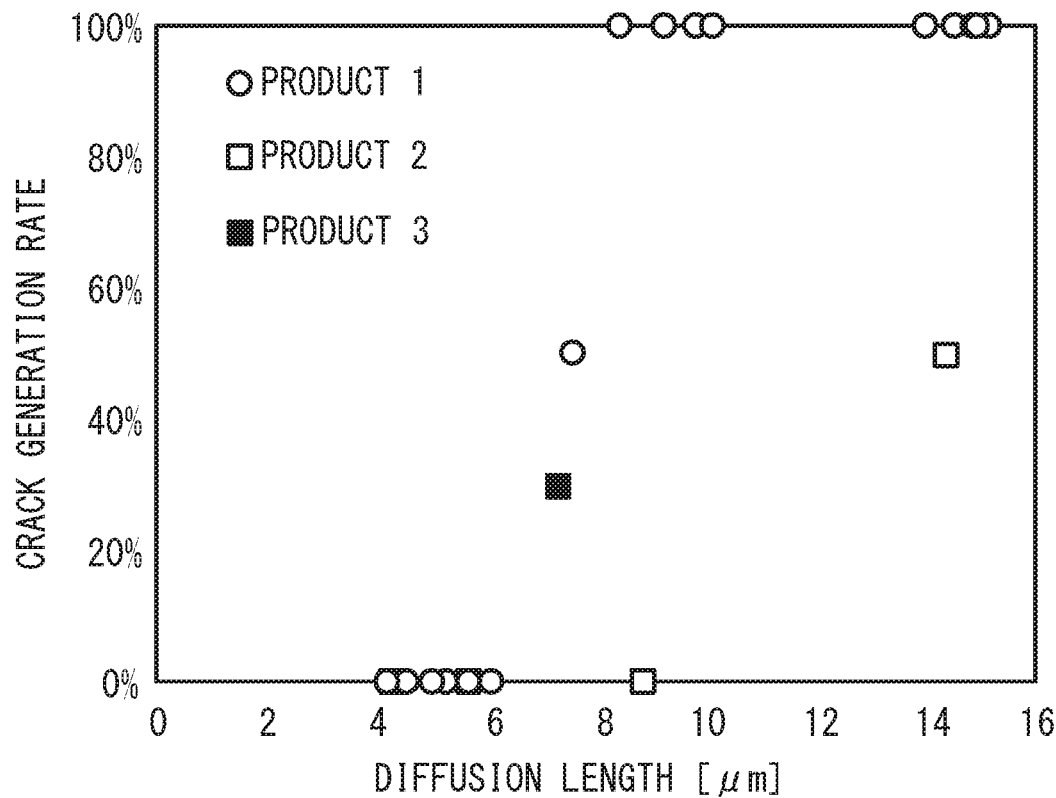
FIG. 6B illustrates a relationship between the diffusion length of Cu and a crack occurrence rate.

FIG. 6A illustrates a relationship between the baking temperature of the base conductive layer 21 and the length L (a diffusion length) of the diffusion region 12a of Cu formed in the internal electrode layer 12. The baking temperature is the highest temperature during baking. As illustrated in FIG. 6A, as the baking temperature becomes higher, the diffusion length of Cu becomes longer. FIG. 6B illustrates relationships between the length L (a diffusion length) of the diffusion region 12a of Cu and a crack occurrence rate in products 1 to 3 of the multilayer ceramic capacitor having different sizes. As illustrated in FIG. 6B, when the diffusion length is 5 µm or less, the crack occurrence rate is 0% in all the products. Thus, the temperature at which the diffusion length is 5 µm or less (approximately 770° C. or less) is preferably set as the baking temperature of the base conductive layer 21.

Then, the first plated layer 22 is formed on the base conductive layer 21 of the semi-finished product by electrolytic plating. Furthermore, the second plated layer 23 is formed on the first plated layer 22 by electrolytic plating.

In the manufacturing method of the present embodiment, the multilayer chip 10 is subjected to heat treatment in an air atmosphere at a temperature of 600° C. to 700° C. to partially oxidize the edge faces of the internal electrode layers 12 exposed to the two edge faces of the multilayer chip 10. In addition, the conductive paste for base conductive layer is mainly composed of Cu, and contains a glass component. The glass component includes 20 to 30 weight % of ZnO when the total weight of the glass component is defined as 100 weight %. Thus, the oxides 40 including Zn and Ni are formed around the internal electrode layers 12 in the vicinity of the connection part between the internal electrode layers 12 and the external electrodes 20a and 20b during the baking of the external electrodes 20a and 20b (the base conductive layers 21, particularly). This causes the glass component of the conductive paste for base conductive layer to easily blend with the internal electrode layer 12, thereby causing Ni particles of the internal electrode layer 12 and Cu particles of the external electrode 20a, 20b (the base conductive layer 21) to be wet with each other. Thus, the internal electrode layers 12 and the external electrodes 20a and 20b easily react with each other. Therefore, even when the length of the diffusion region 12a of Cu is reduced, i.e., even when the baking temperature of the external electrodes 20a and 20b is lowered, the contact between the internal electrode layers 12 and the external electrodes 20a and 20b improves. In addition, formation of the oxides 40 including Zn and Ni around the internal electrode layer 12 improves the adhesion between the internal electrode layer 12 and the dielectric layer 11. Thus, penetration of water is inhibited, and the moisture resistant reliability of the multilayer ceramic capacitor 100 is therefore improved.

[First Variation]

Figure 7:
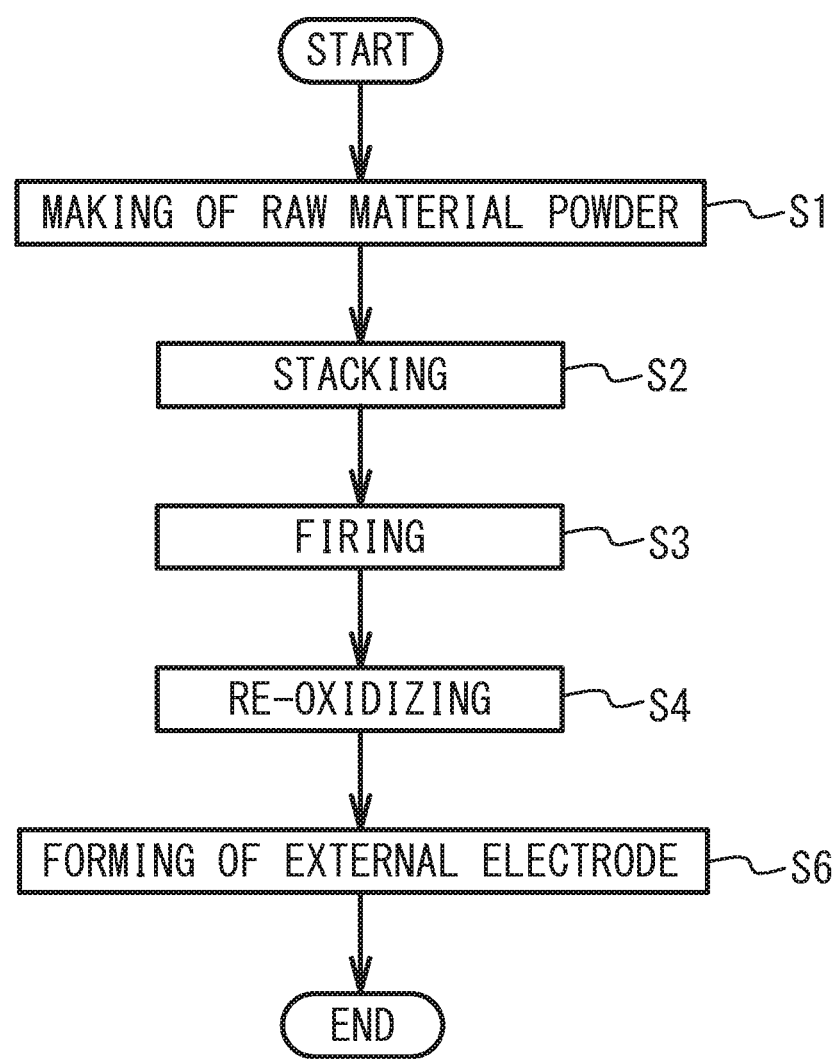
FIG. 7 is a flowchart of a method of manufacturing the multilayer ceramic capacitor in accordance with a first variation of the embodiment.

Next, a description will be given of a method of manufacturing the multilayer ceramic capacitor 100 in accordance with a first variation of the embodiment. FIG. 7 is a flowchart of the method of manufacturing the multilayer ceramic capacitor 100 in accordance with the first variation. Here, only the process different from those in the method of manufacturing the multilayer ceramic capacitor 100 illustrated in FIG. 5 will be described, and the description of the other processes is omitted.

[Forming Process of External Electrodes (S6')]

In the first variation, heat treatment in an air atmosphere is not performed before forming of the external electrodes. In the first variation, after firing or re-oxidizing, the conductive paste for base conductive layer is applied to the two edge faces of the multilayer chip 10 to which the internal electrode layer patterns are exposed. The conductive paste for base conductive layer includes powder of Cu, which is the main component metal of the base conductive layer 21, a glass component, a binder, a solvent, and other auxiliary agents as needed. The binder and the solvent may be the same as those of the ceramic paste described above. The glass component includes 20 to 30 weight % of ZnO when the total weight of the glass component is defined as 100 weight %.

Then, the multilayer chip 10 to which the conductive paste for base conductive layer is applied is baked in a nitrogen atmosphere at a temperature of approximately 770° C. or less. During the baking, the oxygen concentration in the temperature rising region is made to be 10 ppm or greater. This causes the oxides 40 including Zn and Ni to be formed around the internal electrode layer 12 in the vicinity of the connection part between the internal electrode layer 12 and the external electrode 20a, 20b.

In the manufacturing method of the first variation, the conductive paste for base conductive layer mainly composed of Cu and containing a glass component including 20 to 30 weight % of ZnO is applied to the two edge faces, to which the internal electrode layer patterns are exposed, of the multilayer chip 10. Then, the multilayer chip 10 to which the conductive paste for base conductive layer is applied is baked in a nitrogen atmosphere at a temperature of approximately 770° C. or less. During the baking, the oxygen concentration in the temperature rising region is made to be 10 ppm or greater. This causes the oxides 40 including Zn and Ni to be formed around the internal electrode layer 12 in the vicinity of the connection part between the internal electrode layer 12 and the external electrode 20a, 20b, thereby causing the glass component of the conductive paste for base conductive layer to easily blend with the internal electrode layer 12. Thus, Ni particles of the internal electrode layer 12 and Cu particles of the external electrode 20a, 20b (the base conductive layer 21) are wet with each other, and this makes the internal electrode layer 12 and the external electrode 20a, 20b easily react with each other. Therefore, even when the length of the diffusion region 12a of Cu is reduced, i.e., even when the baking temperature of the external electrode 20a, 20b is lowered, the contact between the internal electrode layer 12 and the external electrode 20a, 20b is improved. In addition, formation of the oxides 40 including Zn and Ni around the internal electrode layer 12 improves the adhesion between the internal electrode layer 12 and the dielectric layer 11. Thus, penetration of water is inhibited, and the moisture resistant reliability of the multilayer ceramic capacitor 100 is therefore improved.

[Second Variation]

Figure 8:
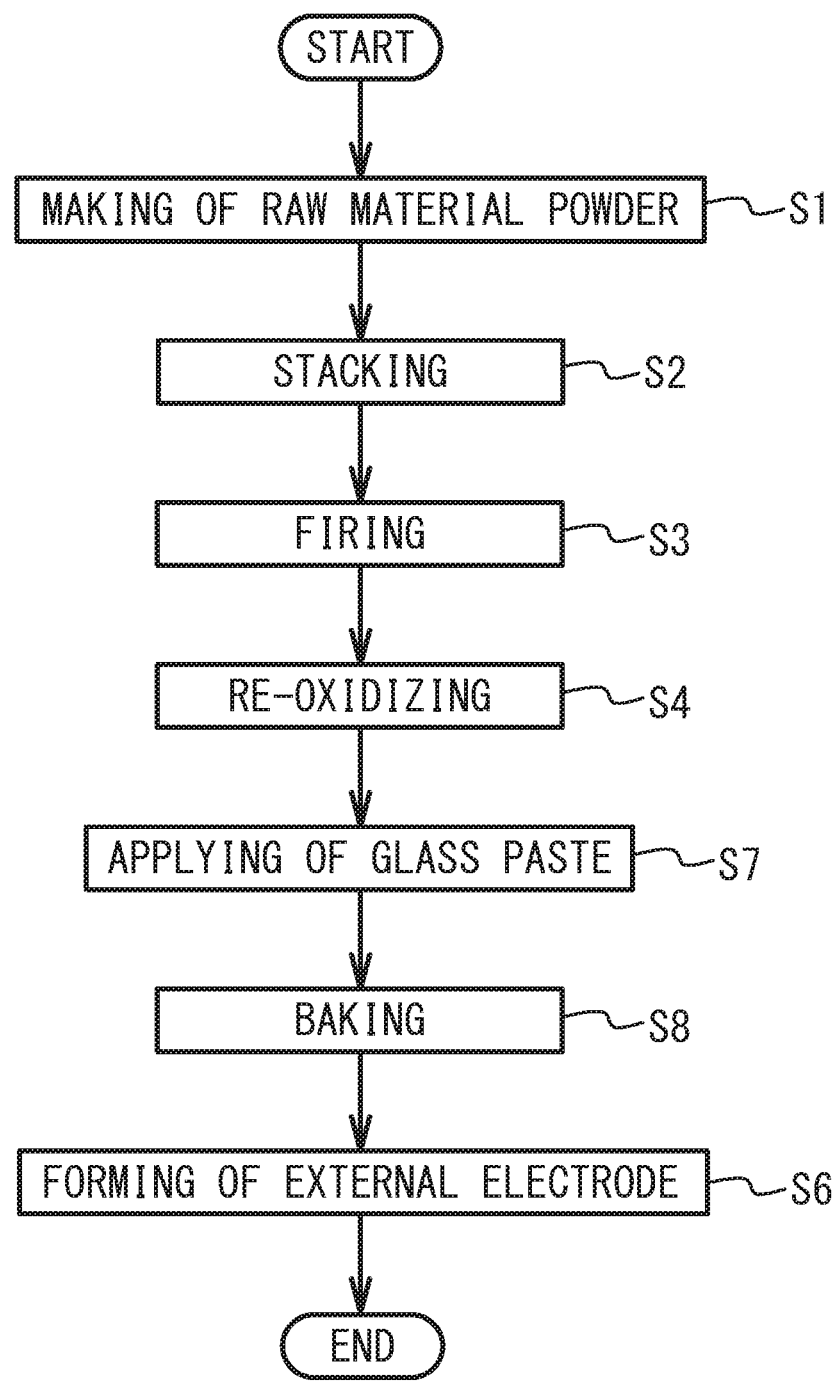
FIG. 8 is a flowchart of a method of manufacturing the multilayer ceramic capacitor in accordance with a second variation of the embodiment.

Next, a description will be given of a method of manufacturing the multilayer ceramic capacitor 100 in accordance with a second variation. FIG. 8 is a flowchart of the method of manufacturing the multilayer ceramic capacitor 100 in accordance with the second variation. Only the processes different from those of the method of manufacturing the multilayer ceramic capacitor 100 illustrated in FIG. 5 will be described, and the description of other processes is omitted.

[Application Process of Glass Paste (S7)]

As illustrated in FIG. 8, a glass paste containing a glass component is applied to each of the two edge faces of the multilayer chip 10 (the edge faces on which the external electrodes 20a and 20b are to be formed) in a thin layer before the formation process of the external electrodes. Through this process, the glass paste is applied to the edge face of the internal electrode layer 12. Here, the glass component includes 20 to 30 weight % of ZnO when the total weight of the glass component is defined as 100 weight %.

[Baking Process (S8)]

Then, the glass paste is baked at a temperature of 600° C. to 700° C. Through this process, the oxides 40 including Zn and Ni are formed around the internal electrode layer 12 in the vicinity of the connection part between the internal electrode layer 12 and the external electrode 20a, 20b.

[Forming Process of External Electrode (S6)]

The conductive paste for base conductive layer is applied to each of the two edge faces of the multilayer chip 10 on which the glass paste is baked. The conductive paste for base conductive layer contains powder of Cu, which is the main component metal of the base conductive layer 21, a glass component, a binder, a solvent, and other auxiliary agents as needed. The binder and the solvent may be the same as those of the ceramic paste described above. In the second variation, the ratio of ZnO included in the glass component of the conductive paste for base conductive layer is not particularly limited. Then, the multilayer chip 10 to which the conductive paste for base conductive layer is applied is baked in a nitrogen atmosphere at a temperature of approximately 770°

C. or less. Through this process, the base conductive layer 21 is baked, and a semi-finished product of the multilayer ceramic capacitor 100 is obtained. Then, the first plated layer 22 is formed on the base conductive layer 21 of the semi-finished product by electrolytic plating. Furthermore, the second plated layer 23 is formed on the first plated layer 22 by electrolytic plating.

In the manufacturing method of the second variation, the glass paste containing the glass component including 20 to 30 weight % of ZnO is applied to the edge faces of the internal electrode layers 12 before forming of the external electrodes 20a and 20b, and is then baked. Thus, compared with the manufacturing method illustrated in FIG. 5, oxides made of Ni and Zn are uniformly formed around the internal electrode layers 12. Thus, the contact between the internal electrode layer 12 and the external electrode 20a, 20b can be improved.

In the embodiment and the variations described above, the multilayer ceramic capacitor is described as an example of the ceramic electronic component, but this does not intend to suggest any limitation. For example, the ceramic electronic component may be other electronic components such as a varistor and a thermistor.

EXAMPLES

The multilayer ceramic capacitor of the embodiment was fabricated, and the characteristics were examined.

Example 1

In an example 1, titanate barium was used as the main component ceramic of the dielectric layer 11. Additive compound was added to barium titanate powder. The resulting barium titanate powder was sufficiently wet blended and was crushed in a ball mill. Thus, a dielectric material was obtained. An organic binder and a solvent were added to the dielectric material, and dielectric green sheets were made by a doctor blade method. The organic binder was polyvinyl butyral (PVB) resin or the like. The solvent was ethanol, toluene or the like. A plasticizer and so on were added as needed. Then, a conductive paste for internal electrode layer was made. The conductive paste for internal electrode layer included powder of the main component metal Ni of the internal electrode layer 12, a binder, a solvent, and other auxiliary agents as needed. The conductive paste for internal electrode layer is screen-printed on the dielectric sheet. Five hundred of sheets each on which the conductive paste for internal electrode layer is printed were stacked, and cover sheets were stacked on and under the sheets. Thereafter, the ceramic multilayer structure is obtained by heating and compressing, and is cut into a predetermined shape. After a binder was removed from the obtained ceramic multilayer structure in a $N_2$ atmosphere, and the resulting ceramic multilayer structure was fired to obtain the multilayer chip 10. The multilayer chip 10 had a length of 1.6 mm, a width of 0.8 mm, and a height of 0.8 mm.

The resulting multilayer chip 10 was subjected to heat treatment in an air atmosphere at a temperature of 600° C. to 700° C.

A conductive paste for base conductive layer containing a Cu filler, a glass component, a binder, and a solvent was applied to the multilayer chip 10 after heat treatment, and was then dried. The rate of the weight of ZnO to the total weight of the glass component was 23 weight %. Thereafter, the conductive paste for base conductive layer was baked for 10 minutes in a nitrogen atmosphere at 760° C. The oxygen concentration in the temperature rising region during the baking of the conductive paste for base conductive layer was made to be less than 1 ppm.

Thereafter, a Ni plated layer was formed as the first plated layer 22 on the base conductive layer 21 by electrolytic plating, and a Sn plated layer was formed as the second plated layer 23 on the first plated layer 22 by electrolytic plating. Four hundred of samples of the example 1 were fabricated.

Example 2

In an example 2, the multilayer chip 10 after firing was not subjected to heat treatment in an air atmosphere. Therefore, in the example 2, the conductive paste for base conductive layer was applied to the multilayer chip 10 after firing, and was then dried. In the example 2, the oxygen concentration in the temperature rising region during baking of the conductive paste for base conductive layer was made to be 10 ppm. Other conditions were the same as those of the example 1. Four hundred of samples of the example 2 were fabricated.

The composition of the glass component and the oxygen concentration in the temperature rising region during baking of the conductive paste for base conductive layer are presented in Table 1.

TABLE 1

| | | Example 1 | Example 2 | Comparative example 1 | Comparative example 2 | Comparative example 3 |
|---|---|---|---|---|---|---|
| Heat treatment after firing | | Performed | Not performed | Not performed | Performed | Not performed |
| Oxygen concentration (in temperature rising region) during baking of external electrodes | | <1 ppm | 10 ppm | <1 ppm | <1 ppm | 10 ppm |
| Composition of glass component in conductive paste for base conductive layer [wt %] | BaO | 62 | 62 | 74 | 74 | 74 |
| | ZnO | 23 | 23 | 11 | 11 | 11 |
| | CaO | 4 | 4 | 4 | 4 | 4 |
| | $Al_2O_3$ | 4 | 4 | 4 | 4 | 4 |
| | $SiO_2$ | 7 | 7 | 7 | 7 | 7 |

In a comparative example 1, in the glass component contained in the conductive paste for base conductive layer, the ratio of the weight of ZnO to the total weight of the glass component was 11 weight %, and the multilayer chip 10 after firing was not subjected to heat treatment in an air atmosphere. Other conditions were the same as those of the example 1. In a comparative example 2, in the glass component contained in the conductive paste for base conductive layer, the ratio of the weight of ZnO to the total weight of the glass component was 11 weight %, and other conditions were the same as those of the example 1. In a comparative example 3, in the glass component contained in the conductive paste for base conductive layer, the ratio of the weight of ZnO to the total weight of the glass component was 11 weight %, and other conditions were the same as those of the example 2. Four hundred of samples of each of the comparative examples 1 to 3 were fabricated.

For the examples 1 and 2 and the comparative examples 1 to 3, the length of the diffusion region 12a of Cu was measured. In addition, formation of oxides made of Zn and Ni and the rate of occurrence of reduction in capacitance were examined. Furthermore, the moisture resistant reliability test was conducted. The number of samples of which the capacitance became less than 80% of a desired capacitance was examined for the reduction in capacitance. In the moisture resistant reliability test, a withstand voltage test of 10 V at temperature=85° C., relative humidity=85%, was performed for 400 hours, and the number of abnormal samples of which the insulation resistance value became 1 MΩ or less was examined. The results are presented in Table 2.

In any of the examples 1 and 2 and the comparative examples 1 to 3, the length of the diffusion region 12a of Cu was 5 μm or less. In the examples 1 and 2, formation of oxides including Zn and Ni was observed. But in the comparative examples 1 to 3, formation of oxides including Zn and Ni was not observed.

In the comparative examples 1 to 3, reduction in capacitance occurred. This is considered because since oxides including Zn and Ni were not formed in the comparative examples 1 to 3, the reaction between the internal electrode layers 12 and the external electrodes 20a and 20b did not sufficiently proceed, and the contact between the internal electrode layers 12 and the external electrodes 20a and 20b therefore degraded. On the other hand, in the examples 1 and 2, occurrence of reduction in capacitance was reduced to 0/400. This is considered because since oxides including Zn and Ni were formed, the internal electrode layers 12 and the external electrodes 20a and 20b easily reacted with each other, and the contact between the internal electrode layers 12 and the external electrodes 20a and 20b was improved even though the baking temperature was low.

For each of the comparative examples 1 and 2, in the moisture resistant reliability test, the number of abnormal samples was two. On the other hand, in the examples 1 and 2, the number of abnormal samples was zero. This is considered because since oxides including Zn and Ni were formed around the internal electrode layer 12 in the examples 1 and 2, the adhesion between the internal electrode layer 12 and the dielectric layer 11 was improved, and penetration of water was therefore inhibited.

TABLE 2

|  | Example 1 | Example 2 | Comparative example 1 | Comparative example 2 | Comparative example 3 |
|---|---|---|---|---|---|
| Cu diffusion length (measured value) [μm] | 4.1 | 3.9 | 4.1 | 4.0 | 4.2 |
| Formation of oxides including Zu and Ni | Observed | Observed | Not observed | Not observed | Not observed |
| Reduction in capacitance | 0/400 | 0/400 | 3/400 | 2/400 | 1/400 |

TABLE 2-continued

|  | Example 1 | Example 2 | Comparative example 1 | Comparative example 2 | Comparative example 3 |
|---|---|---|---|---|---|
| Moisture resistant reliability test | 0/400 | 0/400 | 2/400 | 2/400 | 0/400 |

Example 3

The multilayer chip 10 fired without forming the external electrodes was prepared. The multilayer chip 10 had a length of 1.6 mm, a width of 0.8 mm, and a height of 0.8 mm.

A glass paste containing a glass component including 23 weight % of ZnO was applied to the edge faces of the multilayer chip 10 in a thin layer, and was then baked at a temperature of 600° C. to 700° C.

A conductive paste for base conductive layer containing a Cu filler, a glass component, a binder, and a solvent was applied to the edge faces of the multilayer chip 10, and was then dried. The ratio of the weight of ZnO to the total weight of the glass component in the conductive paste for base conductive layer was made to be 11 weight %.

Thereafter, the conductive paste for base conductive layer was fired for 10 minutes in a nitrogen atmosphere at 760° C. The composition of the glass component and the oxygen concentration in the temperature rising region during baking of the conductive paste for base conductive layer are presented in Table 3.

TABLE 3

|  |  | Example 3 | Comparative example 4 |
|---|---|---|---|
| Heat treatment after firing |  | — | — |
| Application of glass paste |  | Performed | Not performed |
| Thickness of applied glass paste |  | 2 μm | — |
| Oxygen concentration (in temperature rising region) during baking of external electrodes |  | <1 ppm | <1 ppm |
| Composition of glass component in conductive paste for base conductive layer [wt %] | BaO | 74 | 74 |
|  | ZnO | 11 | 11 |
|  | CaO | 4 | 4 |
|  | $Al_2O_3$ | 4 | 4 |
|  | $SiO_2$ | 7 | 7 |

Thereafter, the first plated layer 22 was formed on the base conductive layer 21 by electrolytic plating, and the second plated layer 23 was then formed on the first plated layer 22 by electrolytic plating. Four hundred of samples of the example 3 were fabricated.

In a comparative example 4, no glass paste was applied. Other conditions were the same as those of the example 3. Four hundred of samples of the comparative example 4 were fabricated.

For each of the example 3 and the comparative example 4, formation of oxides made of Zn and Ni, and the rate of occurrence of reduction in capacitance were examined. Furthermore, the moisture resistant reliability test was performed.

The results are presented in Table 4. In the example 3, formation of oxides including Zn and Ni was observed, but in the comparative example 4, formation of oxides including Zn and Ni was not observed. In the comparative example 4, reduction in capacitance occurred. This is considered because since oxides including Zn and Ni were not formed in the comparative example 4, the reaction between the internal electrode layers 12 and the external electrodes 20a and 20b did not sufficiently proceed, and the contact between the internal electrode layers 12 and the external electrodes 20a and 20b therefore degraded. On the other hand, in the example 3, occurrence of reduction in capacitance was reduced to 0/400. This is considered because since oxides including Zn and Ni were formed, the internal electrode layers 12 and the external electrodes 20a and 20b easily reacted with each other, and the contact between the internal electrode layers 12 and the external electrodes 20a and 20b improved even though the low baking temperature was low.

In addition, in the comparative example 4, the number of abnormal samples in the moisture resistant reliability test was two. On the other hand, in the example 3, the number of abnormal samples was zero. This is considered because since oxides including Zn and Ni were formed around the internal electrode layer 12 in the example 3, the adhesion between the internal electrode layer 12 and the dielectric layer 11 improved and thereby, the penetration of water was inhibited.

TABLE 4

|  | Example 3 | Comparative example 4 |
| --- | --- | --- |
| Formation of oxides including Zu and Ni | Observed | Not observed |
| Reduction in capacitance | 0/400 | 3/400 |
| Moisture resistant reliability test | 0/400 | 2/400 |

Although the embodiments of the present invention have been described in detail, it is to be understood that the various change, substitutions, and alterations could be made hereto without departing from the spirit and scope of the invention.

What is claimed is:

1. A ceramic electronic component comprising:
    a multilayer chip having a substantially rectangular parallelepiped shape and including dielectric layers and internal electrode layers that are alternately stacked, the internal electrode layers being alternately exposed to two edge faces of the multilayer chip facing each other; and
    a pair of external electrodes respectively formed on the two edge faces so as to be connected to the internal electrode layers exposed on the respective edge faces, each external electrode extending to at least one side face of the multilayer chip,
    wherein in the multilayer chip, oxides including Zn and Ni are present around the internal electrode layer in a vicinity of a connection part connecting the internal electrode layer to the external electrode.

2. The ceramic electronic component according to claim 1, wherein:
    the external electrodes each includes a base conductive layer and a plated layer thereon, and
    in the internal electrode layer, a diffusion length of a main component of the base conductive layer, as measured along the internal electrode layer inwardly from the edge face is 5 μm or less.

3. The ceramic electronic component according to claim 1, wherein the internal electrode layer has an average thickness of 0.5 μm or less.

4. A method of manufacturing a ceramic electronic component, comprising:
    alternately stacking green sheets for ceramic dielectric layers and first conductive pastes for internal electrode layers so that the internal electrode layers are alternately exposed to two edge faces facing each other so as to form a ceramic multilayer structure having a substantially rectangular parallelepiped shape, the first conductive pastes being mainly composed of Ni;
    firing the ceramic multilayer structure to form a multilayer chip;
    subjecting the multilayer chip to heat treatment;
    disposing a second conductive paste on each of the two edge faces of the multilayer chip such that the second conductive paste is in contact with the internal electrode layers exposed to the corresponding edge face, the second conductive paste containing metal powder and a glass component including 20 to 30 weight % of ZnO; and
    baking the second conductive paste to form oxides including Zn and Ni around each of the internal electrode layers in a vicinity of a connection part between the internal electrode layer and the second conductive paste.

5. A method of manufacturing a ceramic electronic component, comprising:
    alternately stacking green sheets for ceramic dielectric layers and first conductive pastes for internal electrode layers so that the internal electrode layers are alternately exposed to two edge faces facing each other so as to form a ceramic multilayer structure having a substantially rectangular parallelepiped shape, the first conductive pastes being mainly composed of Ni;
    firing the ceramic multilayer structure to form a multilayer chip;
    disposing a second conductive paste on each of the two edge faces of the multilayer chip such that the second conductive paste is in contact with the internal electrode layers exposed to the corresponding edge face, the second conductive paste containing metal powder and a glass component including 20 to 30 weight % of ZnO; and
    baking the second conductive paste while an oxygen concentration in a temperature rising region is made to be 10 ppm or greater, to form oxides including Zn and Ni around each of the internal electrode layers in a vicinity of a connection part between the internal electrode layer and the second conductive paste.

6. A method of manufacturing a ceramic electronic component, comprising:
    alternately stacking green sheets for ceramic dielectric layers and first conductive pastes for internal electrode layers so that the internal electrode layers are alternately exposed to two edge faces facing each other so as to form a ceramic multilayer structure having a substantially rectangular parallelepiped shape, the first conductive pastes being mainly composed of Ni;
    firing the ceramic multilayer structure to form a multilayer chip;
    applying a glass paste containing 20 to 30 weight % of ZnO to each of the two edge faces of the multilayer chip;
    baking the glass paste to form oxides including Zn and Ni around each of the internal electrode layers adjacent to the two edge faces;
    disposing a second conductive paste on each of the two edge faces of the multilayer chip such that the second conductive paste is in contact with the internal electrode layers exposed to the corresponding edge face, the second conductive paste containing metal powder and a glass component; and baking the second conductive paste.

\* \* \* \* \*